United States Patent [19]

Tarr

[11] 3,991,272
[45] Nov. 9, 1976

[54] AUDIO AGC AMPLIFIER

[76] Inventor: Lloyd A. Tarr, 295 Grace St., Elmhurst, Ill. 60126

[22] Filed: Sept. 8, 1975

[21] Appl. No.: 611,044

[52] U.S. Cl. .................................. 179/1 VL; 330/29
[51] Int. Cl.² ............................................ H03G 3/30
[58] Field of Search .......... 179/1 R, 1 A, 1 F, 1 HF, 179/1 P, 1 VL, 1 VC; 325/305, 316, 397, 400, 402, 403; 330/29

[56] References Cited
UNITED STATES PATENTS

| | | | |
|---|---|---|---|
| 3,398,381 | 8/1968 | Torick et al. | 325/402 |
| 3,624,491 | 11/1971 | Fidi et al. | 179/1 VC |
| 3,805,177 | 4/1974 | Risley | 179/1 VL |
| 3,921,091 | 11/1975 | Van Kessel et al. | 330/29 |

Primary Examiner—Kathleen H. Claffy
Assistant Examiner—E. Matt Kemeny

[57] ABSTRACT

An automatic gain control circuit for limiting the acoustical power to the receiver portion of a telephone operator's headset. The circuit provides means whereby the maximum level of acoustic energy output a telephone operator is subjected to is controlled to levels well below those where damage to the ear can occur. Features of the invention include the use of diodes in the feedback path of the an amplifier whereby DC currents control the conductivity of the diodes to control the amplifier gain, and a pair of such circuits in phase opposition serve to cancel control current effects on the signal path.

10 Claims, 2 Drawing Figures

AUDIO AGC AMPLIFIER

FIELD OF THE INVENTION

This invention relates to telephony and more particularly to an acoustical shock protection circuit for use with the receiver portion of operator's headsets.

DESCRIPTION OF THE PRIOR ART

The receiver units usually employed in telephone operator's headsets are highly efficient units capable of producing extremely high acoustical output. Highly efficient units are employed because a number of varying levels may be encountered by a telephone operator when connected to normal telephone connections. Such things as the voice level of the speaker, background noise, line conditions, etc. all affect the level of the signals to which she must listen. The energy level of signals from the operator's headset may rise so high as to be very painful and in some cases the eardrum has actually been broken.

In one attempt to remedy this particular difficulty with telephone operator receiver's, silicon varistors have been placed across the receiver. This technique reduces the maximum output level but not enough to eliminate ear damage. With this silicon varistor the maximum output is limited to about 117 DB REL 0.0002 $\mu$ bars. By using a germanium varistor this same level may be reduced to 111 DB REL 0.0002 $\mu$ bars which is still 16 DB above the desired safe level of about 95 DB REL 0.0002 $\mu$ bar.

To overcome the deficiencies outlined above it is desirable to provide an automatic gain control circuit of some sort. The circuit, however, that must be employed must not only limit the maximum amount but it must have a linear characteristic with no gain or loss up to the point wherein the acoustic output is near the maximum. Standard automatic gain control circuitry does not keep the output level constant at high input levels but continues to have a slight increase in output with increases in input. Accordingly it is the object of the present invention to provide a new and improved acoustical shock protection circuit for use with telephone operator's headsets that limits the maximum output of the telephone receiver employed, but have a linear characteristic throughout the lower portion of its range.

SUMMARY OF THE INVENTION

The circuitry of the present invention is that of a balanced automatic gain control circuit with an added input to a control voltage rectifier. The gain control element employed is a triple diode employed in the negative feedback path of an amplifier.

When a diode is driven into conduction its impedance is decreased, thus when employed in the configuration of the present invention the gain of the associated amplifier will be lowered. Since the control voltage must be applied to the diode at the input to the amplifier, the output of the amplifier will have a DC offset. Because the signal also appears across the diode, this impedance change with signal level will introduce distortion. By employing two amplifiers with gain control diodes in opposite direction and inverting the control voltage of the inverted diodes, the two outputs from the two amplifiers may be then summed and both DC offset and distortion will cancel each other. The summed output is then amplified to the required output level and at the same time rectified to provide the necessary control voltages.

When the input signal increases the DC control voltage increases and thus increases the attenuation of the two gain control amplifiers. Since the control diodes are triple diodes, the control voltage will have to reach approximately 1.2 volts before any gain control takes effect. This condition makes it possible to have a linear gain for small input signals. For very large input levels a second input to the rectifier is present. It is the addition of the second input through a diode to the DC control voltage rectifier that actually reduces the output when the input becomes still larger. Because the second input is through a diode, it has no effect until the signal peak exceeds the forward voltage drop of the diode. A varistor across the output of the entire circuit provides one additional step of protection against the output exceeding the maximum safe level.

DESCRIPTION OF THE PREFERRED EMBODIMENT

Figure 1:
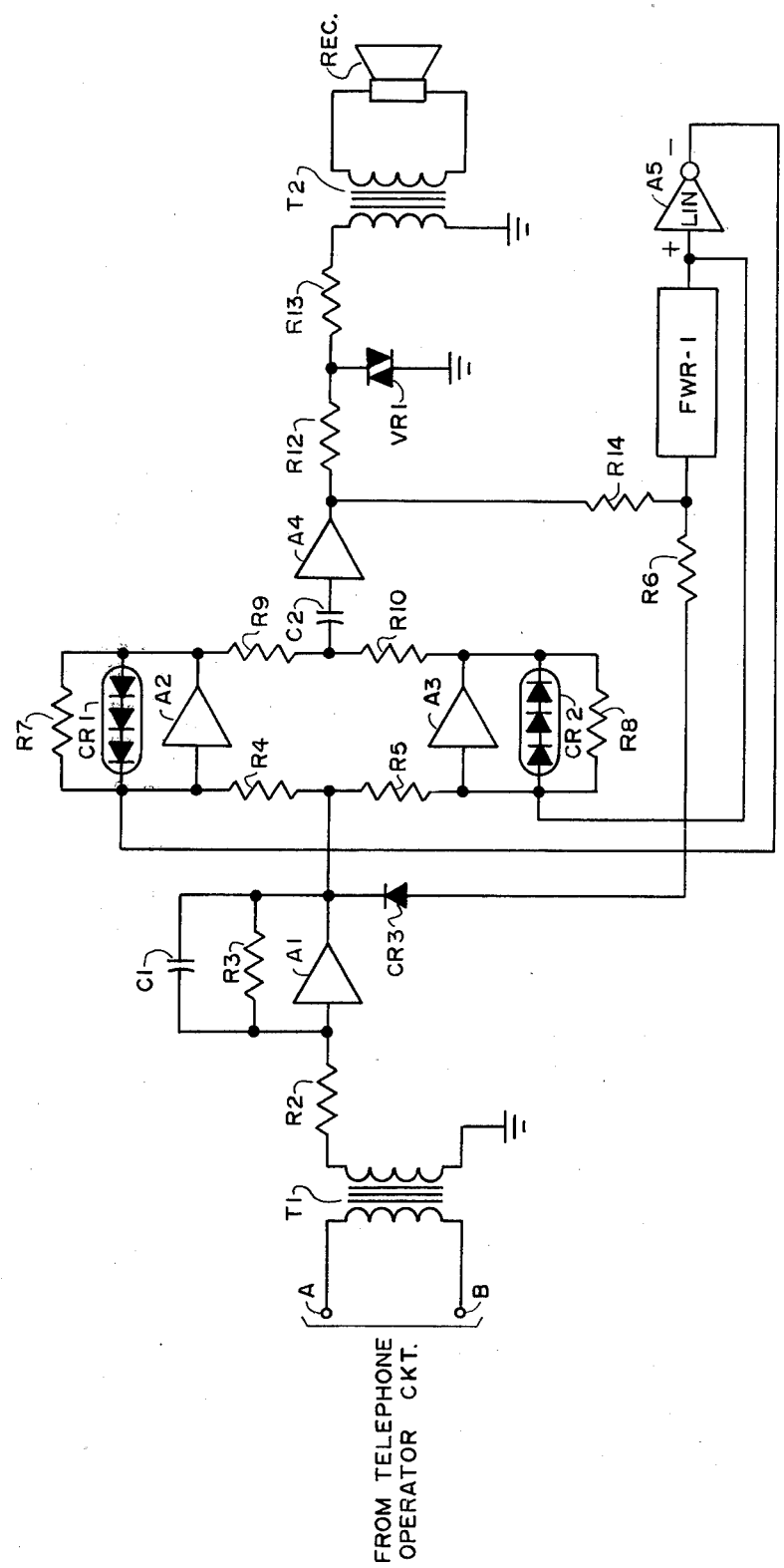
FIG. 1 is a schematic circuit diagram of an acoustical shock protection circuit for an operator's telephone headset receiver in accordance with the present invention.

Referring now to the above referenced FIG. 1 of the drawings the circuit of the present invention is shown. The input signals from an associated operator's telephone circuit are coupled to a transformer T1 whose secondary is connected through resistor R2 to an amplifier A1. Associated with amplifier A1 is a contour network consisting of capacitor C1 and resistor R3. This network provides a measure of high frequency roll off to those amplified signals appearing at the output of amplifier A1. The circuit details of amplifier A1 as well as amplifiers A2, 3, 4 and 5 have not been shown inasmuch as they do not form a portion of the present invention. Any conventional well-known amplifier circuitry constructed so as to operate in a manner described hereinafter will be satisfactory for those portions of the present invention.

Output from amplifier A1 is conducted through resistors R4 and R5 to the control amplifiers A2 and A3. Associated with amplifier A2 and A3 are control diodes CR1 and CR2 respectively as well as resistors R7 and R8 respectively. The output of amplifiers A2 and A3 are taken through resistors R9 and R10 which act as a summing circuit with the resultant combined output coupled through capacitor C2 to the input of amplifier A4. Output signals from amplifier A4 are conducted through resistors R12 and R13 to output transformer T2, whose secondary is connected to the receiver portion of a telephone operator's headset in accordance with the embodiment of the present invention disclosed herein.

Coupled between resistor R12 and R13 is varistor VR1. An output signal from amplifier A4 is also coupled through resistor R14 to the input of full-wave rectifier FWR-1. This full-wave rectifier is of the precision type and the circuitry may be like that of several units commercially available. Also connected to the input of full-wave rectifier FWR-1 is an output from amplifier A1 coupled through diode CR3 and resistor R6. Positive output signals taken from the output of FWR-1 are connected to the combined input of amplifier A3, diode CR2 and resistor R8. Amplifier A5 which has unity gain, functions solely as an inverter to provide a negative output signal identical in magnitude to the aforementioned positive signal. The negative output from amplifier A5 is applied to the combined input of amplifier A2, diode CR1 and resistors R7. The details of operation of the above outlined circuitry will be described in the following.

Input signals from the operator's telephone circuit as noted are coupled via terminals A and B to the primary of transformer T1. Signals are then taken from the secondary and conducted through resistor R2 to the input of amplifier A1. Resistor R2 acts with R3 to set the gain of amplifier A1. Amplifier A1 normally provides a gain of 20 in accordance with the present embodiment and capacitor C1 rolls off the high frequency response. Amplifiers A1 and A3 are employed to provide the necessary gain control. The gain amplifiers A1 and A2 are controlled by the impedance of diodes CR1 and CR2 respectively. As the DC control voltage taken from FRW-1 and amplifier A5 increases, the impedance of diodes CR1 and CR2 is lowered and the subsequent gain of the associated amplifiers will be reduced. The control voltage to triple diode CR1 taken from the output of amplifier A5 is negative while the control voltage to triple diode CR2 taken directly from the output of 4-way rectifier FWR-1 is positive. Because of the presence of a control voltage that amplifies at the inputs of amplifiers A2 and A3 respectively, a DC offset will exist at the outputs in the same magnitude as the input of the DC control voltage just discussed. Since these offset voltages taken from the output of amplifiers A2 and A3 respectively are in opposite direction when summed through resistors R9 and R10 respectively they would be cancelled. Capacitor C2 then acts to block any remaining DC not completely cancelled by the addition. Amplifier A4 provides the remaining alternately current output to the input of transformer T2. It is the same signal taken from the output of amplifier A4 that is rectified by full-wave rectifier FWR-1 to provide the control voltage. As noted above, amplifier A5 inverts the control voltage taken from 4-way recifier FWR-1.

For signal levels in the normal AGC range the control voltage is derived by rectifying the output signal. For input levels up to 30 millivolts the control voltage is below that level wherein diodes CR1 and CR2 will conduct. Because these diodes did not conduct the gain of amplifiers A2 and A3 does not change. Since this is the case signals below 30 millivolts will be in a linear form.

For input level signals above 30 millivolts, the control voltage is high enough to change the impedance of diodes CR1 and CR2 respectively and thus change the gain. For signals in this voltage range the output is at a nearly constant level, increasing slightly as the input voltage increases. If the input signals received from the operator's telephone circuit are of a higher magnitude and the peaks of these signals exceed the voltage drop of diode CR3 the resultant voltage through resistor R6 is applied to the input of full-wave rectifier FWR-1 to develop an additional control voltage.

It may be noticed that by the action of resistors R14 and R6 two separate voltages are developed and summed for application to FWR-1. The additional control voltage developed thus at the output of rectifier FWR-1 is, in proper polarity form, applied to the control circuitry previously outlined, acts to reduce the impedance of diodes CR1 and CR2 in the manner previously discussed. The reduced impedance of diodes CR1 and CR2 then acts to lower the gain over the present circuit. In addition to providing attenuation in the means previously outlined the output is further protected against high levels by the presence of varistor VR1 connected at the junction between resistors R12 and R13. This unit acts to clip maximum voltages appearing for more than a fraction of a second. With the control arrangement shown the actual maximum output is limited by the supply voltage to the amplifiers and is 105 DB which is possible for a period of 25 milliseconds, until the control voltage is able to reduce the gain of amplifiers A2 and A3.

Figure 2:
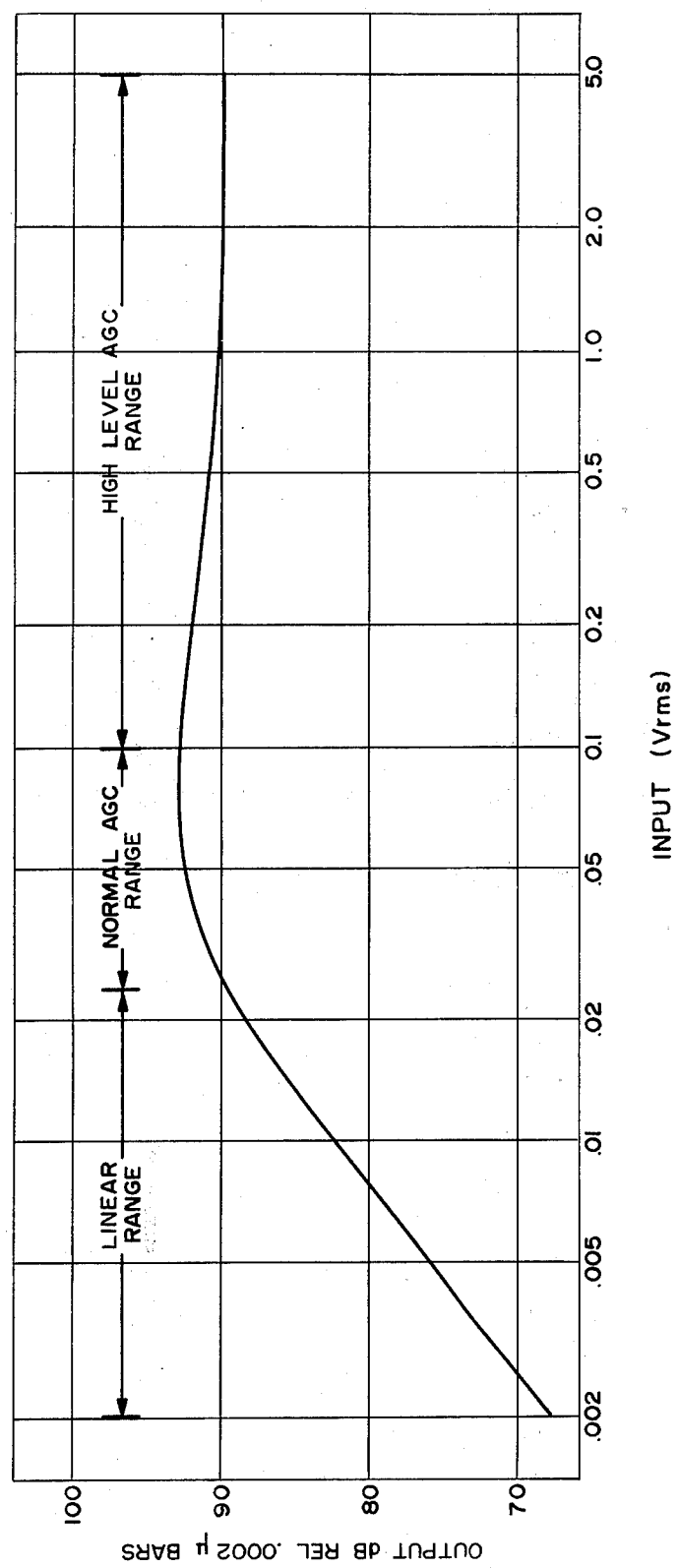
FIG. 2 is a wave form of the output signal from the circuit of the present invention.

A curve showing an output signal as might be applied through transformer T2 to the receiver REC is shown in FIG. 2. As may be noted by reference to this figure an output signal is shown predicated on input signals from 0.002 to 5 volts RMS as an input. As shown output signals based on inputs of 0.002 volts to approximately 0.03 volts will provide outputs over a linear range from less than 70 DB to approximately 90 DB REL 0.0002 $\mu$ bars. Input signals above 0.03 millivolts and up to about 0.1 volts (RMS) result in normal AGC action wherein the developed control voltage controls amplifiers A2 and A3 to retain the output signals in the present circuitry between about 90 and 93 DB. If the signal continues to increase in magnitude beyond this point, additional voltage appearing (from about 0.1 through 5 volts) at this input will be conducted through diode CR3 to provide additional control voltages for amplifiers A2 and A3 with resultant output signals being reduced from about 92 DB to 90 DB on a gradual basis with increasing input voltages.

While but a single embodiment of the present invention has been shown it will be obvious to those skilled in the art that numerous modifications may be made without departing from the spirit and scope of the invention which shall be limited only by the claims appended hereto. It shall also be obvious from the aforegoing that application of the present automatic gain control circuit may find numerous uses outside the specific application disclosed herein.

What is claimed is:

1. An automatic gain control circuit connected between a source of AC electrical signals of variable magnitude and a transducer for audibly reproducing said signals, said automatic gain control circuit comprising: first and second attenuator circuits, each including an input connected to said signal source and each including an output connected to said transducer; control signal means including an input connected to the output of said attenuators, first and second output circuits each connected to a different one of said attenuator circuits and said input circuit further connected to said source of signals; said control signal means initially operated in response to said electrical signals coupled through said attenuators to generate control signals for each of said attenuators to initially control the magnitude of said signals conducted through said attenuators, and said control signal means further operated to generate control signals to further control said attenuators in response to signals from said signal source.

2. An automatic gain control circuit as claimed in claim 1 wherein: there is further included an amplifier connected between said source of electrical signals and said attenuator circuits.

3. An automatic gain control circuit as claimed in claim 2, wherein: said amplifier includes high frequency response controlling means.

4. An automatic gain control circuit as claimed in claim 1 wherein: there is further included an amplifier connected between both of said attenuators and said transducer.

5. An automatic gain control circuit as claimed in claim 4 wherein: there is further included a varistor, including a circuit connection between said amplifier and said transducer.

6. An automatic gain control circuit as claimed in claim 1 wherein: said attenuators each comprise an amplifier and a uni-directional conducting device connected in parallel.

7. An automatic gain control circuit as claimed in claim 6 wherein: said uni-directional conducting devices in each of said attenuators are polarized in opposite directions.

8. An automatic gain control circuit as claimed in claim 1 wherein: said control signal means comprise AC to DC conversion means for converting said electrical signals to control signals.

9. An automatic gain control circuit as claimed in claim 8 wherein: there is further included an inverter circuit connected between the output of said conversion means and one of said attenuator circuits.

10. An automatic gain control circuit as claimed in claim 1 wherein: there is further included uni-directional conducting means connected between said source of electrical signals and said control signal means.

* * * * *